(12) United States Patent
Bishara et al.

(10) Patent No.: US 12,743,024 B2
(45) Date of Patent: Sep. 22, 2026

(54) METHODS AND MECHANISMS FOR MODIFYING MACHINE-LEARNING MODELS FOR NEW SEMICONDUCTOR PROCESSING EQUIPMENT

(71) Applicant: Applied Materials, Inc., Santa Clara, CA (US)

(72) Inventors: Waheb Bishara, San Mateo, CA (US); Subhasish Bandyopadhyay, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 838 days.

(21) Appl. No.: 18/115,309

(22) Filed: Feb. 28, 2023

(65) Prior Publication Data

US 2024/0288779 A1 Aug. 29, 2024

(51) Int. Cl.
*G03F 7/00* (2006.01)

(52) U.S. Cl.
CPC .......... *G03F 7/705* (2013.01); *G03F 7/70516* (2013.01)

(58) Field of Classification Search
USPC ............................................................ 716/53
See application file for complete search history.

(56) References Cited

U.S. PATENT DOCUMENTS

2023/0113095 A1* 4/2023 Dixit ...................... G05B 13/04 700/32
2023/0222394 A1* 7/2023 Hong ..................... G06N 20/20 706/12
2023/0317481 A1* 10/2023 Li ....................... H10P 72/0602 438/625

FOREIGN PATENT DOCUMENTS

WO WO-2023191947 A1 * 10/2023 ............ G06N 20/10

* cited by examiner

*Primary Examiner* — Mohammed Alam
(74) *Attorney, Agent, or Firm* — Lowenstein Sandler LLP

(57) ABSTRACT

An electronic device manufacturing system configured to identify, by a processor, a first machine-learning model trained to generate predictive data for a first process chamber and obtain metrology data associated with a substrate produced by a second process chamber. The manufacturing system is further configured to train a second machine-learning model based on the first machine-learning model and the metrology data, wherein the second machine-learning model is trained to generate predictive data associated with the second process chamber.

20 Claims, 9 Drawing Sheets

METHODS AND MECHANISMS FOR MODIFYING MACHINE-LEARNING MODELS FOR NEW SEMICONDUCTOR PROCESSING EQUIPMENT

TECHNICAL FIELD

The present disclosure relates to building a machine-learning model to predict performance of semiconductor processing equipment, updating the machine-learning model to predict performance of other semiconductor processing equipment, and using the machine-learning model to converge faster to a desired process during the development phase.

BACKGROUND

Products can be produced by performing one or more manufacturing processes using manufacturing equipment. For example, semiconductor manufacturing equipment can be used to produce semiconductor devices (e.g., substrates) via semiconductor manufacturing processes. The manufacturing equipment can, according to a process recipe, deposit multiple layers of film on the surface of the substrate and can perform an etch process to form the intricate pattern in the deposited film. For example, the manufacturing equipment can perform a chemical vapor deposition (CVD) process to deposit alternative layers on the substrate. Etch process equipment can then be used to remove material from areas of a substrate through, e.g., chemical reaction and/or physical bombardment.

A typical substrate processing method has multiple different processes, with some advanced methods (e.g., plasma etching) having twenty or even more processes. Each process has a multitude of process control variables, also referred to as "knobs," that can be used to tune and optimize performance. Therefore, the space available to tune and optimize a given process is theoretically extremely large.

Process engineers use their experience and expertise to select a preliminary baseline process and fine-tune the process based on a limited number of substrates (or portions of substrates, referred to as coupons) dedicated for design of experiment (DoE). The goal of DoE is to tailor the process to achieve desired specification on a substrate. However, dedicating full substrates or portions of substrate for DoE data collection consume valuable resources. Therefore, often the adopted process may be a viable one, but not necessarily the optimum solution.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, an electronic device manufacturing system configured to obtain, by a processor, a first machine-learning model trained to generate first predictive data for a first process chamber and obtain metrology data associated with a substrate produced by a second process chamber. The manufacturing system is further configured to train a second machine-learning model based on the first machine-learning model and the metrology data, wherein the second machine-learning model is trained to generate second predictive data associated with the second process chamber.

A further aspect of the disclosure includes a method according to any aspect or implementation described herein.

A further aspect of the disclosure includes a non-transitory computer-readable storage medium comprising instructions that, when executed by a processing device operatively coupled to a memory, performs operations according to any aspect or implementation described herein.

BRIEF DESCRIPTION OF THE DRAWINGS

The present disclosure is illustrated by way of example, and not by way of limitation in the figures of the accompanying drawings.

DETAILED DESCRIPTION

Figure 1:
FIG. 1 is a block diagram illustrating an example system architecture, in accordance with some implementations of the present disclosure.
Figure 1:
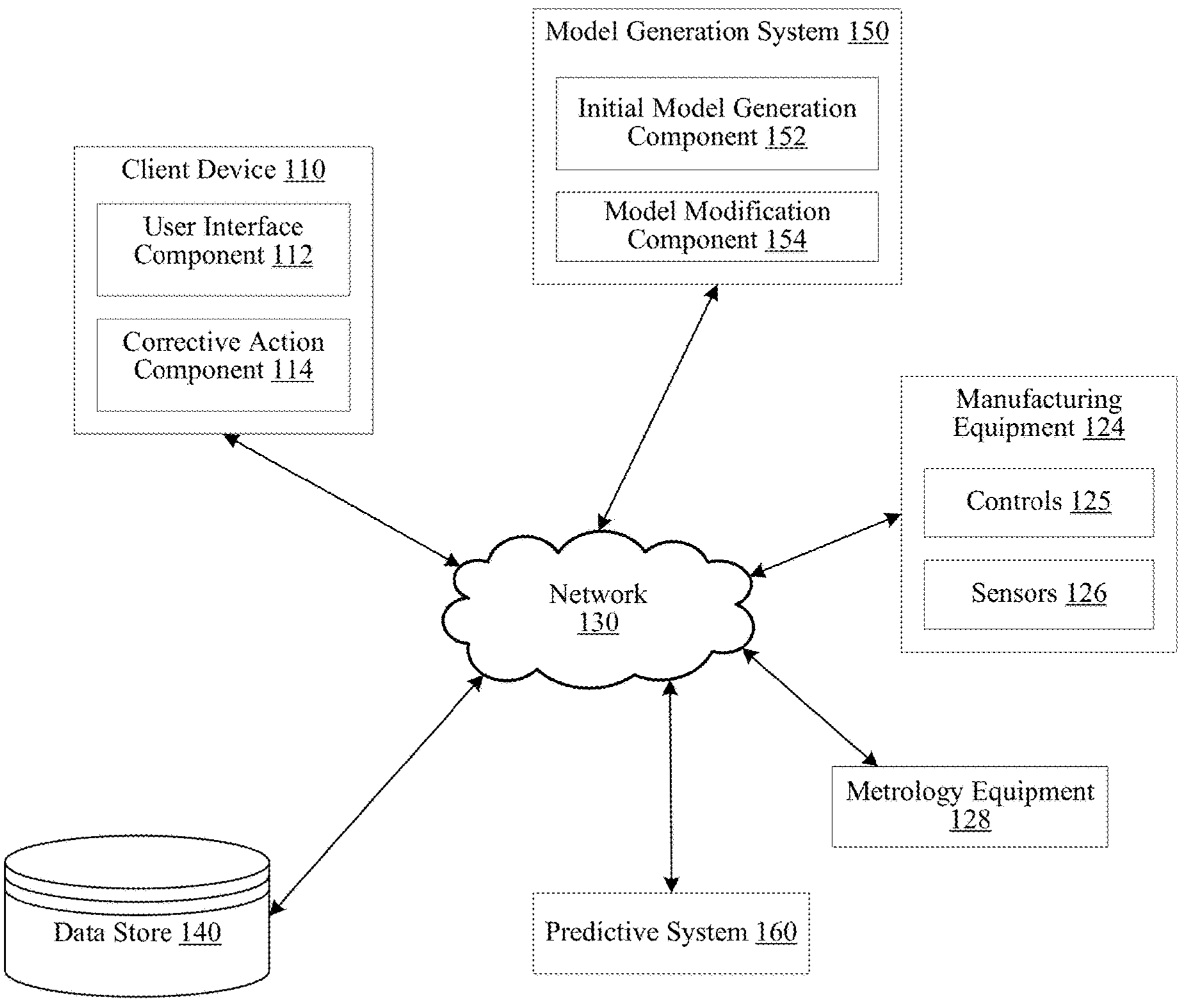

Described herein are technologies directed to methods and mechanisms for modifying a machine-learning model built for predicting the performance of semiconductor processing equipment (also referred to as "process chambers"). In substrate manufacturing, a film can be deposited on a surface of a substrate during a deposition process (e.g., a deposition (CVD) process, an atomic layer deposition (ALD) process, and so forth) performed at a process chamber of a manufacturing system. For example, in a CVD process, the substrate is exposed to one or more precursors, which react on the substrate surface to produce the desired deposit. The film can include one or more layers of materials that are formed during the deposition process, and each layer can include a particular thickness gradient (e.g., changes in the thickness along a layer of the deposited film). For example, a first layer can be formed directly on the surface of the substrate (referred to as a proximal layer or proximal end of the film) and have a first thickness. After the first layer is formed on the surface of the substrate, a second layer having a second thickness can be formed on the first layer. This process continues until the deposition process is completed and a final layer is formed for the film (referred to as the distal layer or distal end of the film). The film can include alternating layers of different materials. For example, the film can include alternating layers of oxide and nitride layers (oxide-nitride-oxide-nitride stack or ONON stack), alternating oxide and polysilicon layers (oxide-polysilicon-oxide-polysilicon stack or OPOP stack), and so forth.

The film can be subjected to, for example, an etch process to form a pattern on the surface of the substrate, a chemical-mechanical polishing/planarization (CMP) process to smooth the surface of the film, or any other process necessary to manufacture the finished substrate. An etch process can include exposing highly energetic process gas (e.g., a plasma) with a sample surface to break down the materials at the surface, which can then be removed by a vacuum system.

A process chamber can perform each substrate manufacturing process (e.g., the deposition process, the etch process, the polishing process, etc.) according to a process recipe. A process recipe defines a particular set of operations to be performed for the substrate during the process and can include one or more settings associated with each operation. A process recipe can be embodied as a table of recipe settings including a set of inputs or recipe parameters ("parameters") and processes that are manually entered by a user (e.g., process engineer) to achieve a set of target properties (e.g., on-substrate characteristics), also referred to as a set of goals. For example, a deposition process recipe can include a temperature setting for the process chamber, a pressure setting for the process chamber, a flow rate setting for a precursor for a material included in the film deposited on the substrate surface, etc. Accordingly, the thickness of each film layer, the depth of each etch, and so forth, can be correlated to these process chamber settings.

As an illustration, a plasma etch process can have more than twenty steps, and there may be twenty or more knobs available to control each process step by controlling various process parameters that can be varied (also known as process variables). Examples of process variables for an etch step that can be controlled by an associated knob may include plasma radio frequency (RF) power, pressure, temperature, composition and proportion of gases in the gas mixtures used to generate the plasma etc. The settings of the knobs affect density of radicals or ions in plasma and other factors that define the process. The process space available to tune and optimize a given process is extremely large and it is practically impossible to explore the entire process space empirically within any reasonable process qualification time frame, let alone being able to perform multi-dimensional process space optimization as an abstract concept. Furthermore, due to the interaction between the knobs and their impact on the process performance, it is extremely hard to predict the combined effect of simultaneous knob control by manually scanning one knob at a time. This task becomes even more complicated for a large number of steps in a single process, or when multiple processes (each process having its associated steps) are involved.

Process engineers recognize that huge windows of operation cannot be covered by manual optimization. However, to achieve acceptable levels of performance, process engineers rely on prior experience and knowledge to choose an initial process, and adjust a few knobs (i.e., fewer than a full set of available knobs) within a process space in an attempt to control variation of one or more feature-level dimensions of interest. The knowledge-based initial process may be a baseline process.

In some systems, a machine-learning model can be developed to digitally generate virtual recipes for any set of conditions within a process space. The term "virtual recipe" can refer to a process recipe generated using a machine-learning model of a substrate, e.g., a virtual substrate, rather than a physical substrate. The term "virtual substrate" can encompass not only substrates, but other objects as well, such as masks to perform mask-based metrology. The machine-learning model can use machine-learning techniques to leverage the synergy between metrology data and various knobs. The term "knob" can be used to indicate variables that can be controlled to control a manufacturing process. Knobs are sometimes also referred to as process control variables, or simply process variables.

The machine-learning model can accelerate process qualification for new semiconductor processing equipment, cover a significantly larger process space that cannot be explored empirically, and identify a process window and its correlation to equipment hardware, final device performance and other process parameters. During the research and development phase, the machine-learning model can provide for faster convergence to target process recipes using only a limited number of test substrates. During production ramp leading to high volume manufacturing (HVM), the machine-learning model can enable tighter control of the process window not only intra-substrate, but also between substrates in a single lot (substrate-to-substrate control), or between different lots of substrates (lot-to-lot control).

In some systems, machine-learning models are generated for a particular recipe performed at a particular process chamber. Different process chambers can have hardware variations (e.g., different chuck temperatures, different lid temperatures, differences in the power delivery to each process chamber, differences in gas flow and/or pressure, etc.) that require different knob settings for the same recipe. As such, a machine-learning model developed for a process recipe used at one process chamber may generate incorrect data when applied to the same process recipe used at a different process chamber.

Furthermore, deterioration of the process chamber and/or components of the process chamber (due to, for example, corrosion, erosion, etc.) or maintenance of a process chamber can require adjustments (via one or more knobs) to the process recipe to prevent the process chamber from producing a substrate not meeting the requirements. Machine-learning models used by current systems may be incapable of compensating for these deteriorations or maintenances. Training a machine-learning model for each process chamber is an expensive and time-consuming process that may require use of twenty of more substrates per recipe for each process chamber. Therefore, a system capable of modifying an existing machine-learning model for use by different process chambers or for use by an altered (e.g., deteriorating or post maintenance) process chamber is desirable.

Aspects and implementations of the present disclosure address these and other shortcomings of the existing technology by enabling the modification of a machine-learning model for predicting the performance of an altered process chamber or process chamber(s) different from the one the initial machine-learning model was developed for. In some implementations, the present system can be configured to initially train a machine-learning model to determine relationships between metrology data of interest and various knobs that control the substrate manufacturing process. In particular, the machine-learning model can be configured to predict, using a particular recipe or knob data as input, the variability of one or more dimensions of interest across a substrate or a portion of a substrate. The dimensions of interest may be geometrical dimensions of physical features on the substrate, e.g., a line width, a height of a structure, a sidewall angle, a top critical dimension (TCD), a bottom critical dimension (BCD) or any other feature-level three-dimensional profile information.

To generate the initial machine-learning model, the present system can obtain process control variable data (e.g., knob data) used by a particular process chamber to perform a particular manufacturing process (e.g., deposition process, etch process, etc.) on a substrate. The present system can also obtain the metrology data associated with the substrate (e.g., film thickness data, etch depth data, etc.). The system can map the data knob data to the metrology data to train the initial machine-learning model. In some implementations, this initial machine-learning is trained to generate predictive data for the particular recipe run by the particular process chamber. In some implementations, the initial machine-learning model can receive, as input, knob data and generate, as output, predictive metrology data. In some implementations, the initial machine-learning model can receive, as input, desired spatial measurements and generate, as output, predictive knob data (or predictive recipe data). Training the initial machine-learning model can, in some implementations, require data from a dozen or more prior substrates on which the manufacturing process was run.

The present system can then modify (update) the machine-learning model for use by a different process chamber or by the altered initial process chamber. The initial process chamber can be altered due to deterioration of one or more component, due to maintenance procedures performed on the process chamber (e.g., replacement of one or more components, restoration of one or more components, new coating, etc.). To modify the machine-learning model, the present system can use one or more transfer learning methods to repurpose the machine-learning model for use by the different or altered process chamber. Transfer learning is a machine-learning method where a machine-learning model developed for a task is reused as the starting point for a model on a different task. In one example, the present system can run the process recipe on one or more substrates in the different or altered process chamber. The system can then obtain the metrology data generated for the substrate. The present system can then modify the machine-learning model based on the new metrology data. In particular, the present system can use the new metrology data and a portion of the initial machine learning model to generate a modified machine learning model for use by the different or altered process chamber. In some implementations, respective modified machine-learning models can be generated for each respective process chamber running the particular recipe.

Aspects of the present disclosure result in technological advantages in using fewer test substrates to generate a machine-learning models capable of generating predictive data for certain process chambers. In one example, the aspects of the present disclosure can use a single test substrate to generate machine-learning model for a process chamber. This can result in the ability to generate machine-learning models for a fleet of process chambers running a particular recipe by generating an initial model for one process chamber, and generating modified models for each other process chamber using fewer test substrates than needed to generate the initial model. The predictive data obtained from each machine-learning model can provide significant reduction in time and materials required to optimize knob setting for each process chambers. The models can also be used to maintain and control a tight process window during high volume manufacturing.

It is noted that the scope of the disclosure is not limited to only spatial distribution of geometrical dimensions. Non-limiting examples of spatial process measures include distribution of doping concentration of certain species across the substrate, porosity across the substrate, etc.

FIG. 1 depicts an illustrative computer system architecture 100, according to aspects of the present disclosure. In some implementations, computer system architecture 100 can be included as part of a manufacturing system for processing substrates. Computer system architecture 100 includes a client device 110, manufacturing equipment 124, predictive system 160 (e.g., to generate predictive data, to provide model adaptation and modification, to use a knowledge base, etc., which will be described in detail in FIG. 3), data store 140, and model generation system 150. The manufacturing equipment 124 can include sensors 126 configured to capture data for a substrate being processed at the manufacturing system. In some implementations, the manufacturing equipment 124 and sensors 126 can be part of a sensor system that includes a sensor server (e.g., field service server (FSS) at a manufacturing facility) and sensor identifier reader (e.g., front opening unified pod (FOUP) radio frequency identification (RFID) reader for sensor system). In some implementations, metrology equipment 128 can be part of computer system architecture 100 that includes a metrology server (e.g., a metrology database, metrology folders, etc.) and metrology identifier reader (e.g., FOUP RFID reader for metrology system).

Manufacturing equipment 124 can produce products, such as electronic devices, following a recipe or performing runs over a period of time. Manufacturing equipment 124 can include a process chamber. Manufacturing equipment 124 can perform a process for a substrate (e.g., a wafer, etc.) at the process chamber. Examples of substrate processes include a deposition process to deposit one or more layers of film on a surface of the substrate, an etch process to form a pattern on the surface of the substrate, etc. Manufacturing equipment 124 can perform each process according to a process recipe. A process recipe defines a particular set of operations to be performed for the substrate during the process and can include one or more settings associated with each operation. For example, a deposition process recipe can include a temperature setting for the process chamber, a pressure setting for the process chamber, a flow rate setting for a precursor for a material included in the film deposited on the substrate surface, etc. These setting can be set or controlled using one or more knobs.

In some implementations, manufacturing equipment 124 includes sensors 126 that are configured to generate data associated with a substrate processed at manufacturing system 100. For example, a process chamber can include one or more sensors configured to generate spectral or non-spectral data associated with the substrate before, during, and/or after a process (e.g., a deposition process, an etch process, etc.) is performed for the substrate. In some implementations, spectral data generated by sensors 126 can indicate a concentration of one or more materials deposited on a surface of a substrate. Sensors 126 configured to generate spectral data associated with a substrate can include reflectometry sensors, ellipsometry sensors, thermal spectra sensors, capacitive sensors, and so forth. Sensors 126 configured to generate non-spectral data associated with a substrate can include temperature sensors, pressure sensors, flow rate sensors, voltage sensors, etc. For example, each sensor 126 can be a temperature sensor, a pressure sensor, a chemical detection sensor, a chemical composition sensor, a gas flow sensor, a motion sensor, a position sensor, an optical sensor, or any and other type of sensors. Some or all of the sensors 126 can include a light source to produce light (or any other electromagnetic radiation), direct it towards a target, such as a component of the machine 100 or a substrate, a film deposited on the substrate, etc., and detect light reflected from the target. The sensors 126 can be located anywhere inside the manufacturing equipment 124 (for example, within any of the chambers including the loading stations, on one or more robots, on a robot blade, between the chambers, and so one), or even outside the manufacturing equipment 124 (where the sensors can test ambient temperature, pressure, gas concentration, and so on). Further details regarding manufacturing equipment 124 are provided with respect to FIG. 2.

In some implementations, sensors 126 provide sensor data (e.g., sensor values, features, trace data) associated with manufacturing equipment 124 (e.g., associated with producing, by manufacturing equipment 124, corresponding products, such as substrates). The manufacturing equipment 124 can produce products following a recipe or by performing runs over a period of time. Sensor data received over a period of time (e.g., corresponding to at least part of a recipe or run) can be referred to as trace data (e.g., historical trace data, current trace data, etc.) received from different sensors 126 over time. Sensor data can include a value of one or more of temperature (e.g., heater temperature), spacing (SP), pressure, high frequency radio frequency (HFRF), voltage of electrostatic chuck (ESC), electrical current, material flow, power, voltage, etc. Sensor data can be associated with or indicative of manufacturing parameters such as hardware parameters, such as settings or components (e.g., size, type, etc.) of the manufacturing equipment 124, or process parameters of the manufacturing equipment 124. The sensor data can be provided while the manufacturing equipment 124 is performing manufacturing processes (e.g., equipment readings when processing products). The sensor data can be different for each substrate.

In some implementations, manufacturing equipment 124 can include controls 125. Controls 125 can include one or more components or sub-systems configured to enable and/or control one or more processes of manufacturing equipment 124. For example, a sub-system can include a pressure sub-system, a flow sub-system, a temperature sub-system and so forth, each sub-system having one or more components. The component can include, for example, a pressure pump, a vacuum, a gas deliver line, a plasma etcher, actuators etc. In some implementations, controls 125 can be managed based on data from sensors 126, input from a control device, etc.

Metrology equipment 128 can provide metrology data associated with substrates processed by manufacturing equipment 124. The metrology data can include a value of film property data (e.g., wafer spatial film properties), dimensions (e.g., thickness, height, etc.), dielectric constant, dopant concentration, density, defects, etc. In some implementations, the metrology data can further include a value of one or more surface profile property data (e.g., an etch rate, an etch rate uniformity, a critical dimension of one or more features included on a surface of the substrate, a critical dimension uniformity across the surface of the substrate, an edge placement error, etc.). The metrology data can be of a finished or semi-finished product. The metrology data can be different for each substrate. Metrology data can be generated using, for example, reflectometry techniques, ellipsometry techniques, TEM techniques, and so forth.

Reflectometry techniques can include time-domain reflectometry (TDR), frequency-domain reflectometry (FDR), ellipsometry, etc. TDF emits a series of fast pulses, and analyzes the magnitude, duration and shape of the reflected pulses. FDR is based on the transmission of a set of stepped-frequency sine waves from the sample. The signal analysis is focused on the changes in frequency between the incident signal and the reflected signal. Ellipsometry includes the polarization-resolved measurement of light reflections from films. As will be explained in greater detail within, the reflectometry techniques can be used to obtain sensor data (e.g., a reflectance value(s)), which can be processed to generate metrology data.

In some implementations, metrology equipment 128 can be included as part of the manufacturing equipment 124. For example, metrology equipment 128 can be included inside of or coupled to a process chamber and configured to generate metrology data for a substrate before, during, and/or after a process (e.g., a deposition process, an etch process, etc.) while the substrate remains in the process chamber. In some instances, metrology equipment 128 can be referred to as in-situ metrology equipment. In another example, metrology equipment 128 can be coupled to another station of manufacturing equipment 124. For example, metrology equipment can be coupled to a transfer chamber, such as transfer chamber 210 of FIG. 2, a load lock, such as load lock 220, or a factory interface, such as factory interface 206.

The client device 110 can include a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc. In some implementations, the metrology data can be received from the client device 110. Client device 110 can display a graphical user interface (GUI), where the GUI enables the user to provide, as input, metrology measurement values for substrates processed at the manufacturing system. The client device 110 can include user interface (UI) component 112 and corrective action component 114. UI component 112 can receive user input (e.g., via a Graphical User Interface (GUI) displayed via the client device 110) associate with generating a machine-learning model, updating one or more virtual models, etc. The machine learning model can be generated by the predictive system 160, which is discussed with regards to FIG. 3. In some implementations, the input data can be sent to or processed by model generation system 150. Corrective action component 114 can receive user input (e.g., via a Graphical User Interface (GUI) displayed via the client device 110) of an indication associated with manufacturing equipment 124. In some implementations, the corrective action component 114 transmits the indication to the predictive system 160, receives output (e.g., predictive data) from the predictive system 160, determines a corrective action based on the output, and causes the corrective action to be implemented. In some implementations, the corrective action component 114 receives an indication of a corrective action from the predictive system 160 and causes the corrective action to be implemented. Each client device 110 can include an operating system that allows users to one or more of generate, view, or edit data (e.g., indication associated with manufacturing equipment 124, corrective actions associated with manufacturing equipment 124, etc.).

Data store 140 can be a memory (e.g., random access memory), a drive (e.g., a hard drive, a flash drive), a database system, or another type of component or device capable of storing data. Data store 140 can include multiple storage components (e.g., multiple drives or multiple databases) that can span multiple computing devices (e.g., multiple server computers). The data store 140 can store data associated with processing a substrate at manufacturing equipment 124. For example, data store 140 can store data collected by sensors 126 at manufacturing equipment 124 before, during, or after a substrate process (referred to as process data). Process data can refer to historical process data (e.g., process data generated for a prior substrate processed at the manufacturing system) and/or current process data (e.g., process data generated for a current substrate processed at the manufacturing system). Data store can also store spectral data or non-spectral data associated with a portion of a substrate processed at manufacturing equipment 124. Spectral data can include historical spectral data and/or current spectral data.

Data store 140 can also store contextual data associated with one or more substrates processed at the manufacturing system. Contextual data can include a recipe name, recipe step number, preventive maintenance indicator, operator, etc. Contextual data can refer to historical contextual data (e.g., contextual data associated with a prior process performed for a prior substrate) and/or current process data (e.g., contextual data associated with current process or a future process to be performed for a prior substrate). The contextual data can further include identify sensors that are associated with a particular sub-system of a process chamber.

Data store 140 can also store task data. Task data can include one or more sets of operations to be performed for the substrate during a deposition process and can include one or more settings associated with each operation. For example, task data for a deposition process can include a temperature setting for a process chamber, a pressure setting for a process chamber, a flow rate setting for a precursor for a material of a film deposited on a substrate, etc. In another example, task data can include controlling pressure at a defined pressure point for the flow value. Task data can refer to historical task data (e.g., task data associated with a prior process performed for a prior substrate) and/or current task data (e.g., task data associated with current process or a future process to be performed for a substrate).

In some implementations, data store 140 can store statistics data. Statistics data can include statistics representative of the raw data, e.g., mean data (average), range data, standard deviation data, maximum and minimum data, median data, mode data, etc. Mean data can include a measured averages of two or more values. For example, mean data can be used to determine the average heater temperature, the process chamber pressure, the average flowrate of a gas, etc., during a step(s), a specific time duration, an entire process recipe, etc. Range data can include the middle observation in a set of data (e.g., a median temperature during a step). Range data can include the difference between a maximum value and a minimum value of a set of values (e.g., the range of the heater pressure during a process recipe). The standard deviation is measure of the amount of variation or dispersion of a set of values.

In some implementations, data store 140 can be configured to store data that is not accessible to a user of the manufacturing system. For example, process data, spectral data, contextual data, etc. obtained for a substrate being processed at the manufacturing system is not accessible to a user (e.g., an operator) of the manufacturing system. In some implementations, all data stored at data store 140 can be inaccessible by the user of the manufacturing system. In other or similar implementations, a portion of data stored at data store 140 can be inaccessible by the user while another portion of data stored at data store 140 can be accessible by the user. In some implementations, one or more portions of data stored at data store 140 can be encrypted using an encryption mechanism that is unknown to the user (e.g., data is encrypted using a private encryption key). In other or similar implementations, data store 140 can include multiple data stores where data that is inaccessible to the user is stored in one or more first data stores and data that is accessible to the user is stored in one or more second data stores.

In some implementations, data store 140 can be configured to store data associated with known fault patterns. A fault pattern can be a one or more values (e.g., a vector, a scalar, etc.) associated with one or more issues or failures associated with a process chamber sub-system. In some implementations, a fault pattern can be associated with a corrective action. For example, a fault pattern can include parameter adjustment steps to correct the issue or failure indicated by the fault pattern. For example, the predictive system or the corrective action module can compare a determined fault pattern (determined from data obtained from of one or more sensors of a sensor cluster) to a library of known fault patterns to determine the type of failure experienced by a sub-system, the cause of the failure, the recommended corrective action to correct the fault, and so forth.

In some implementations, model generation system 150 can be configured to generate an initial machine-learning model 190, and to modify the initial machine learning model to generate modified machine-learning model 192A-N. Model generation system 150 can include one or more computing devices such as a rackmount server, a router computer, a server computer, a personal computer, a mainframe computer, a laptop computer, a tablet computer, a desktop computer, a GPU, an ASIC, etc. Model generation system 150 can include a data storage device (e.g., one or more disk drives and/or solid-state drives), a main memory, a static memory, a network interface, and/or other components. Model generation system 150 can execute instructions to perform any one or more of the methodologies and/or implementations described herein. In some implementations, model generation system 150 can adjust the performance of one or more features of a machine-learning model (e.g., model 190) to generate a modified machine-learning model (e.g., model 192A-N). In some implementations, model generation system 150 can execute instructions to control one or more operations at predictive system 160 in accordance with a received input (e.g., a user input, a corrective action command, etc.). In some implementations, model generation system 150 can execute instructions to control one or more operations at manufacturing equipment 124 in accordance with a received input (e.g., a user input, a corrective action command, etc.). The instructions can be stored on a computer readable storage medium, which can include the main memory, static memory, secondary storage and/or processing device (during execution of the instructions).

Machine generation system 150 can include initial model generation component 152 and model modification component 154. In some implementations, initial model generation component 152 can be configured to instruct predictive system 160 to generate initial model 190.

In some implementations, model modification component 154 can be configured to instruct predictive system 160 to modify initial model 190 to generate modified model 192A-N. In an illustrative example, initial model generation component 152 can feed, to predictive system 160, a data set (e.g., metrology data, recipe data, sensor data, etc.) obtained from prior substrates using recipes around a baseline recipe. As will be explained in detail with reference to FIG. 3, predictive system 160 can extract meaningful features from the data set (using server machine 170 of FIG. 3) and draw inference to optimize machine-learning engine performance via server machine 180 of FIG. 3). In an example, metrology data obtained from prior substrates can be used to train the model. The metrology measurements can include some reference measurements obtained from previous trustworthy measurements. These reference measurements (sometimes called "golden profile") may not be used during machine-learning model building and process optimization phase, but are often used during subsequent run-time process control.

The machine-learning method can be based on neural network, deep learning or any other known techniques used for regression analysis (e.g., linear, partial least squares, Gaussian, polynomials, convolution neural networks for regression, regression trees and others). In addition to metrology data, the machine-learning engine (e.g., server 180) of the predictive system 160 also receives information about various recipes and knobs, as well as information about the process and the equipment. The machine-learning engines of server machine 180 of FIG. 3 then generates intermediate machine-learning model for each measurement on the substrate. Each measurement can have data about one or more dimensions of interest. The model's performance can be optimized using a penalty function or cost function, such as root mean square error (rMSE) or any other suitable metric. The cost function is sometimes referred to as "objective function," designed to allow optimization of one or more dimensions of interest. The cost function can be for each location on a substrate, or just one cost function for an entire substrate. Cost function can also be for each DoE condition. Optimization routines (including, but not limited to swarm optimization or swarm variants, are designed to minimize non-convex multi-minima hyper-surfaces. Error penalties or regularization terms may be added to the cost function to find higher probability solutions in high dimension non-convex multi-minima hyper-surfaces. Once the desired value of the cost function is obtained, the machine-learning model can be further validated using metrology data from another set of physical DoE substrates. Number of test and validation substrates can be in the range of tens or twenties, but may vary. Depending on how a cost function is chosen, the test and validation process can be repeated spatially for each data point across a substrate for which metrology was conducted. Alternatively, the machine-learning model can be optimized to achieve an average dimensional uniformity across the substrate. The final machine-learning model (e.g., initial machine-learning model 190 of FIG. 3) can combine results from all the data points on the substrate for which metrology was conducted.

Once the machine-learning model is established, the model can be used to determine process sensitivity of knobs for one or both of a mean value of a dimension of interest across the wafer and range of that value across the substrate. Such sensitivity outcome provides great insight to process engineers while developing a new process, helping them to understand how the interaction between different knobs affects the performance. Furthermore, it allows isolating the contribution of each knob on its own and the collective effect of various combinations of the knobs. Multiple (typically three or more) repeats of the baseline process are included in the DoE to capture process variability and metrology variability.

With knowledge of sensitivity of control knobs garnered from the metrology data, there is a limited need to use actual substrates. Process predictions can be obtained digitally for any combination of process knobs, for example tens of thousands or more combinations of knobs, to get process performance distribution or process space. Once a process space is established, a user can identify a stable processing condition without the need to run real substrates. The process model can also work in the "inverse spatial" mode, i.e. the process model takes trustworthy target dimensions across the substrate as input, and suggests virtual recipes that would give the desired performance within the desired process window. It is possible to optimize in spatial mode and the inverse spatial mode in parallel or in series. A limited number of physical DoE substrates may be actually processed to test the efficacy of the results predicted by the model 190.

Model modification component 154 can feed, to predictive system 160, a new data set (e.g., metrology data, recipe data, sensor data, etc.) obtained from a new substrate produced by a different or altered process chamber. Model modification component 154 can then instruct predictive system 160 to modify an initial model (e.g., initial model 190) to generate a modified model (e.g., modified model 192A-N of FIG. 3). In some implementations, the model modification component 154 can use transfer learning to repurpose (modify) initial machine-learning model 190 (e.g., generate modified model 192A-N) for use by the different or altered process chamber. In particular, model modification component 154 can select one or more model components of initial model 190 and input those components along with new data (e.g., new metrology data) to predictive system 160. The one or more model component can include certain layers of the initial machine-learning model 190, certain knob sensitivities of initial model 190, certain assumptions used by initial model 190, etc.). Model modification component 154 can then instruct predictive system 160 to generate modified model 192A-N based on the model components and the new data.

Figure 6:
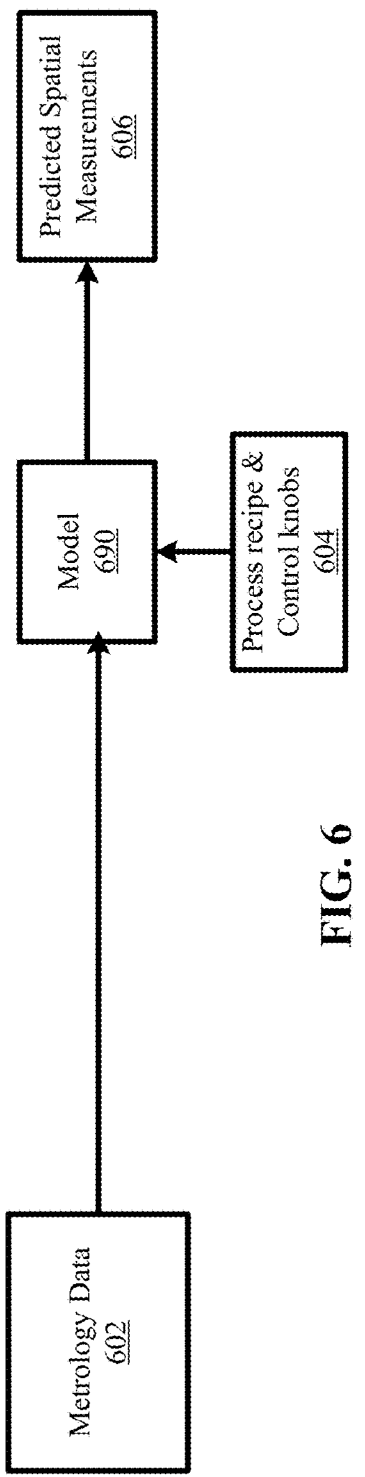
FIGS. 6 and 7 show the two capabilities of the machine-learning model, in accordance with some implementations of the present disclosure.
Figure 7:
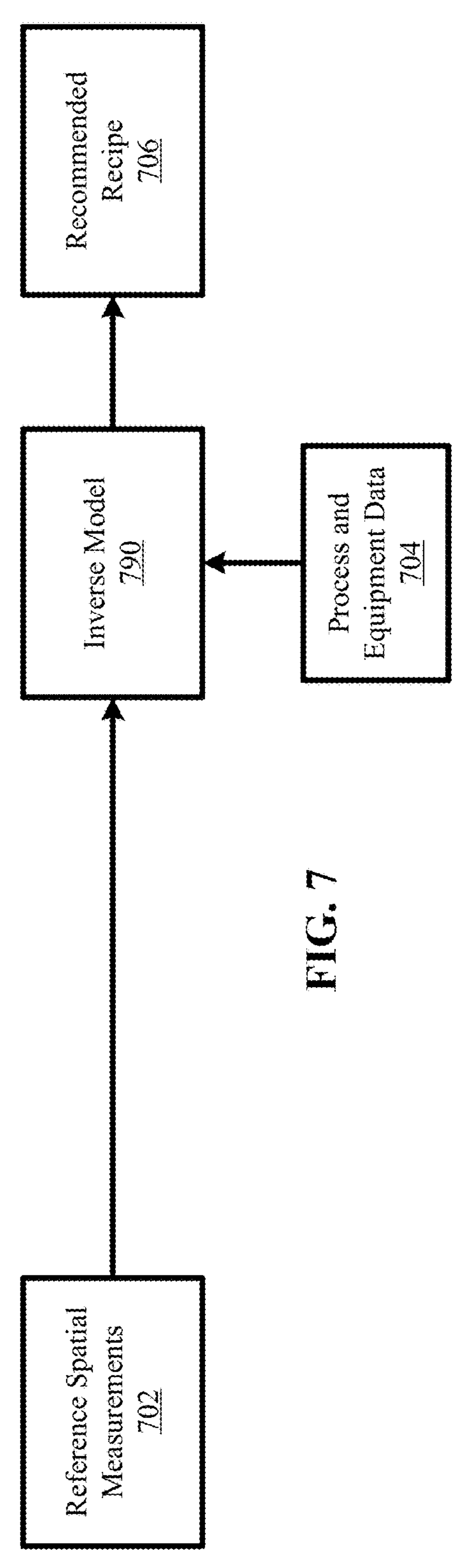

FIG. 6 and FIG. 7 show the two capabilities of the machine-learning model (e.g., initial model 190 and modified model 192A-N. Model 690 and inverse model 790 can be the same or similar to initial model 190 and/or modified model 192A-N. When metrology data 602 is used to generate machine-learning model(s) 690, the machine-learning model can predict spatial dimensions of interest 606 based on various process recipes and control knob information 604. On the other hand, when reference spatial measurements (sometimes called "golden profiles") 702 are used as input, an inverse machine-learning model 790 can recommend recipe 706 for a given process and given equipment (chosen from a database of processes and equipment) when the process and/or equipment data 704 is fed to the inverse model 790. One or both of these two capabilities can be used during the model training and calibration phase as well as during run-time substrate-to-substrate variability control phase. Spatial measurement prediction is more useful during the calibration process, and recipe prediction is more useful during the substrate-to-substrate control phase (for example, maintaining and/or optimizing a process of record (POR) for the HVM phase). The model(s) allows process engineers to define multiple constraints (e.g., process specifications) on the process performance, such as a desired spatial profile per dimension across the substrate, a desired uniformity range, a desired mean value across the substrate, etc. This is referred to a multi-input multi-output (MIMO) process optimization.

The client device 110, manufacturing equipment 124, sensors 126, predictive system 160, model generation system 150, and data store 140 can be coupled to each other via a network 130. In some implementations, network 130 is a public network that provides client device 110 with access to model generation system 150, predictive system 160, data store 140, manufacturing equipment 124 and other publicly available computing devices. In some implementations, network 130 is a private network that provides client device 110 access to manufacturing equipment 124, data store 140, model generation system 150, predictive system 160, and other privately available computing devices. Network 130 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

In implementations, a "user" can be represented as a single individual. However, other implementations of the disclosure encompass a "user" being an entity controlled by a plurality of users and/or an automated source. For example, a set of individual users federated as a group of administrators can be considered a "user."

Figure 2:
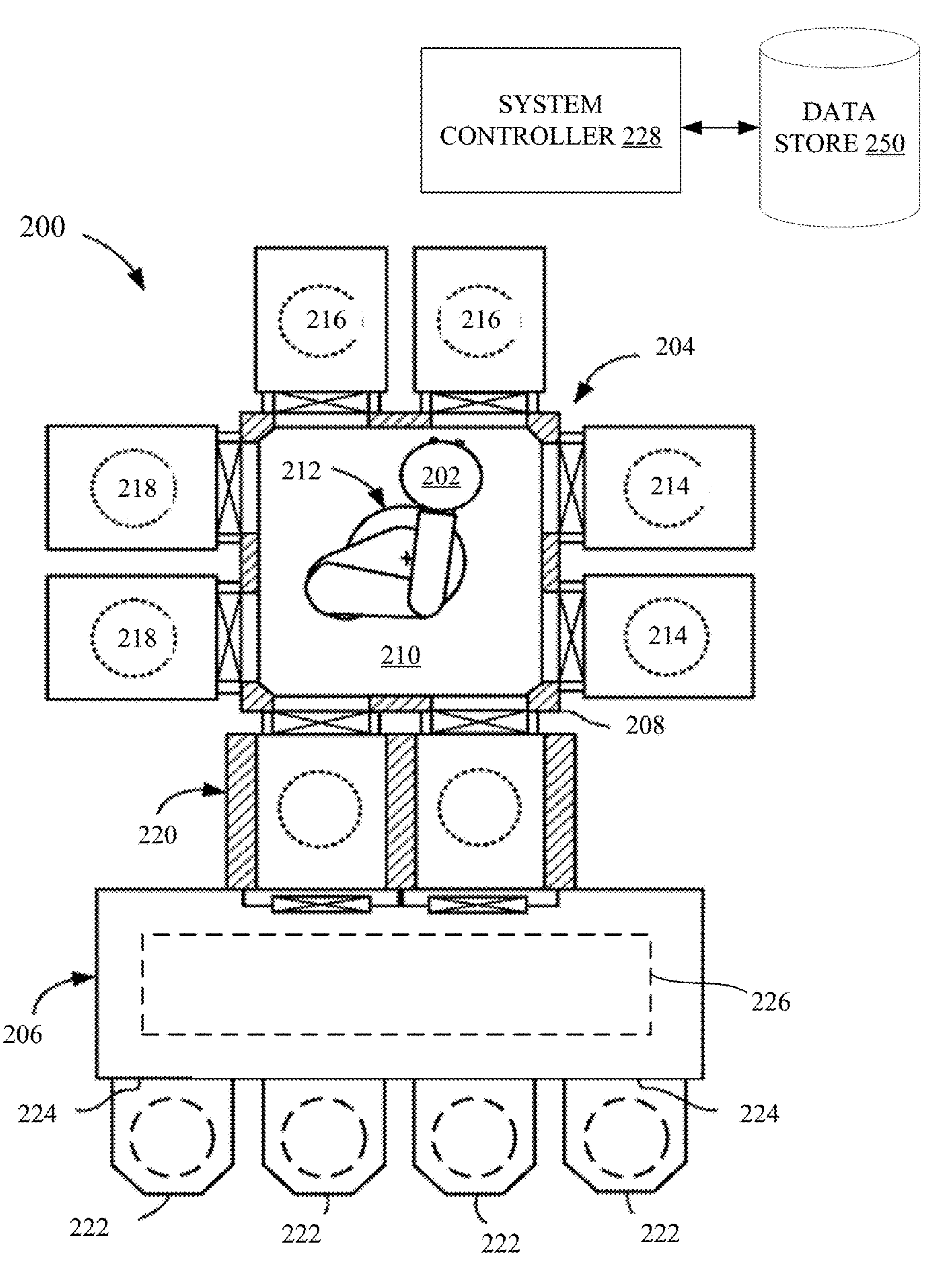
FIG. 2 is a top schematic view of an example manufacturing system, in accordance with some implementations of the present disclosure.

FIG. 2 is a top schematic view of an example manufacturing system 200, according to aspects of the present disclosure. Manufacturing system 200 can perform one or more processes on a substrate 202. Substrate 202 can be any suitably rigid, fixed-dimension, planar article, such as, e.g., a silicon-containing disc or wafer, a patterned wafer, a glass plate, or the like, suitable for fabricating electronic devices or circuit components thereon.

Manufacturing system 200 can include a process tool 204 and a factory interface 206 coupled to process tool 204. Process tool 204 can include a housing 208 having a transfer chamber 210 therein. Transfer chamber 210 can include one or more process chambers (also referred to as processing chambers) 214, 216, 218 disposed therearound and coupled thereto. Process chambers 214, 216, 218 can be coupled to transfer chamber 210 through respective ports, such as slit valves or the like. Transfer chamber 210 can also include a transfer chamber robot 212 configured to transfer substrate 202 between process chambers 214, 216, 218, load lock 220, etc. Transfer chamber robot 212 can include one or multiple arms where each arm includes one or more end effectors at the end of each arm. The end effector can be configured to handle particular objects, such as wafers, sensor discs, sensor tools, etc.

Process chambers 214, 216, 218 can be adapted to carry out any number of processes on substrates 202. A same or different substrate process can take place in each processing chamber 214, 216, 218. A substrate process can include atomic layer deposition (ALD), physical vapor deposition (PVD), chemical vapor deposition (CVD), etching, annealing, curing, pre-cleaning, metal or metal oxide removal, or the like. Other processes can be carried out on substrates therein. Process chambers 214, 216, 218 can each include one or more sensors configured to capture data for substrate 202 before, after, or during a substrate process. For example, the one or more sensors can be configured to capture spectral data and/or non-spectral data for a portion of substrate 202 during a substrate process. In other or similar implementations, the one or more sensors can be configured to capture data associated with the environment within process chamber 214, 216, 218 before, after, or during the substrate process. For example, the one or more sensors can be configured to capture data associated with a temperature, a pressure, a gas concentration, etc. of the environment within process chamber 214, 216, 218 during the substrate process.

In some implementations, metrology equipment (not shown) can be located within the process tool. In other implementations, metrology equipment (not shown) can be located within one or more process chambers 214, 216, 218. In some implementations, the substrate can be placed onto metrology equipment using transfer chamber robot 212. In other implementations, the metrology equipment can be part of the substrate support assembly (not shown). Metrology equipment can provide metrology data associated with substrates processed by manufacturing equipment 124. The metrology data can include a value of film property data (e.g., wafer spatial film properties), dimensions (e.g., thickness, height, etc.), dielectric constant, dopant concentration, density, defects, etc. In some implementations, the metrology data can further include a value of one or more surface profile property data (e.g., an etch rate, an etch rate uniformity, a critical dimension of one or more features included on a surface of the substrate, a critical dimension uniformity across the surface of the substrate, an edge placement error, etc.). The metrology data can be of a finished or semi-finished product. The metrology data can be different for each substrate. Metrology data can be generated using, for example, reflectometry techniques, ellipsometry techniques, TEM techniques, and so forth.

A load lock 220 can also be coupled to housing 208 and transfer chamber 210. Load lock 220 can be configured to interface with, and be coupled to, transfer chamber 210 on one side and factory interface 206. Load lock 220 can have an environmentally-controlled atmosphere that can be changed from a vacuum environment (wherein substrates can be transferred to and from transfer chamber 210) to an at or near atmospheric-pressure inert-gas environment (wherein substrates can be transferred to and from factory interface 206) in some implementations. Factory interface 206 can be any suitable enclosure, such as, e.g., an Equipment Front End Module (EFEM). Factory interface 206 can be configured to receive substrates 202 from substrate carriers 222 (e.g., Front Opening Unified Pods (FOUPs)) docked at various load ports 224 of factory interface 206. A factory interface robot 226 (shown dotted) can be configured to transfer substrates 202 between carriers (also referred to as containers) 222 and load lock 220. Carriers 222 can be a substrate storage carrier or a replacement part storage carrier.

Manufacturing system 200 can also be connected to a client device (e.g., client device 110, not shown) that is configured to provide information regarding manufacturing system 200 to a user (e.g., an operator). In some implementations, the client device can provide information to a user of manufacturing system 200 via one or more graphical user interfaces (GUIs). For example, the client device can provide information regarding a target thickness profile for a film to be deposited on a surface of a substrate 202 during a deposition process performed at a process chamber 214, 216, 218 via a GUI. The client device can also provide information regarding anomaly detection and fault classification, in accordance with implementations described herein.

Manufacturing system 200 can also include a system controller 228. System controller 228 can be and/or include a computing device such as a personal computer, a server computer, a programmable logic controller (PLC), a microcontroller, and so on. System controller 228 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 228 can include a data storage device (e.g., one or more disk drives and/or solid state drives), a main memory, a static memory, a network interface, and/or other components. System controller 228 can execute instructions to perform any one or more of the methodologies and/or implementations described herein. In some implementations, system controller 228 can execute instructions to perform one or more operations at manufacturing system 200 in accordance with a process recipe. The instructions can be stored on a computer readable storage medium, which can include the main memory, static memory, secondary storage and/or processing device (during execution of the instructions).

System controller 228 can receive data from sensors (e.g., sensors 126, now shown) included on or within various portions of manufacturing system 200 (e.g., processing chambers 214, 216, 218, transfer chamber 210, load lock 220, etc.). In some implementations, data received by the system controller 228 can include spectral data and/or non-spectral data for a portion of substrate 202. In other or similar implementations, data received by the system controller 228 can include data associated with processing substrate 202 at processing chamber 214, 216, 218, as described previously. For purposes of the present description, system controller 228 is described as receiving data from sensors included within process chambers 214, 216, 218. However, system controller 228 can receive data from any portion of manufacturing system 200 and can use data received from the portion in accordance with implementations described herein. In an illustrative example, system controller 228 can receive data from one or more sensors for process chamber 214, 216, 218 before, after, or during a substrate process at the process chamber 214, 216, 218. Data received from sensors of the various portions of manufacturing system 200 can be stored in a data store 250. Data store 250 can be included as a component within system controller 228 or can be a separate component from system controller 228. In some implementations, data store 250 can be data store 140 described with respect to FIG. 1.

Figure 3:
FIG. 3 is a block diagram illustrating an example predictive architecture, in accordance with some implementations of the present disclosure.
Figure 3:
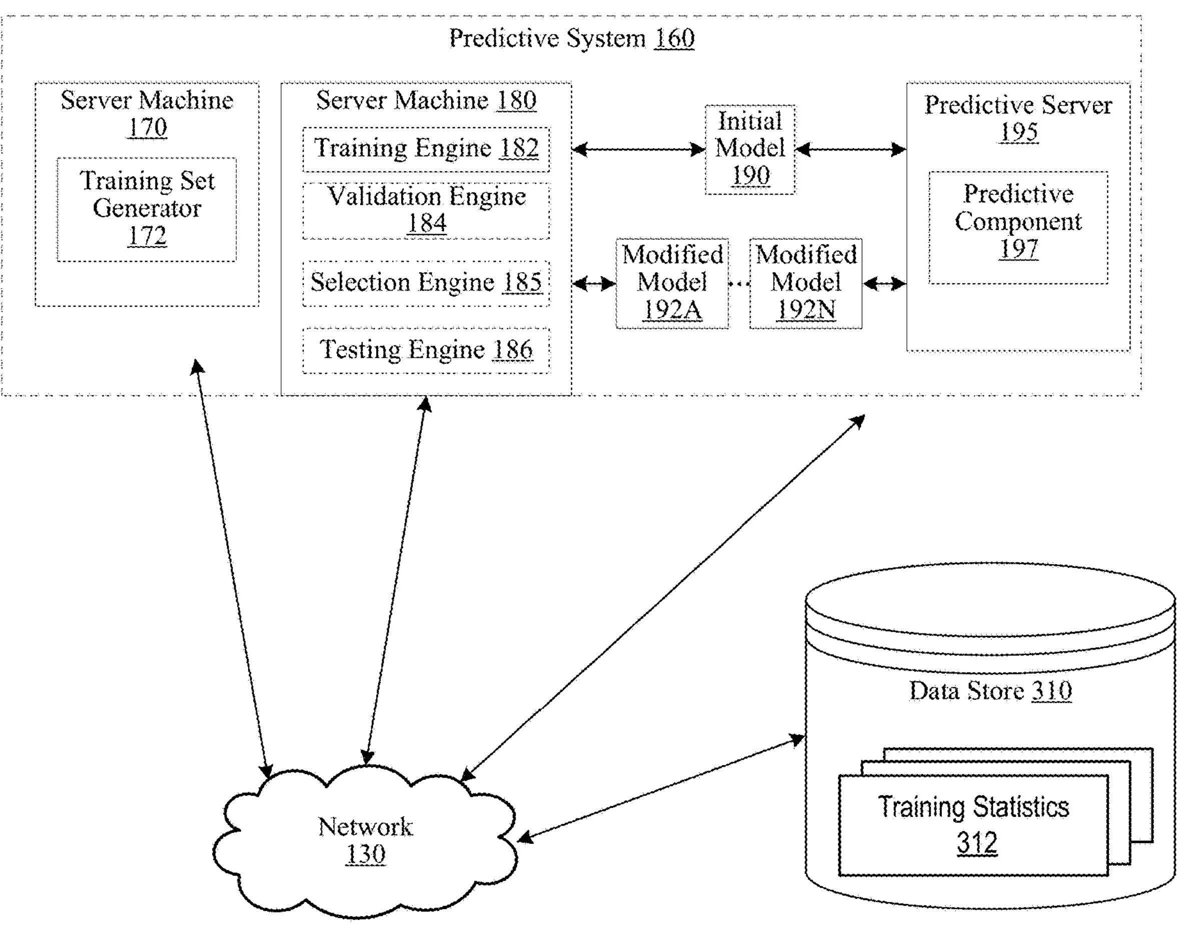

FIG. 3 depicts an illustrative predictive architecture 300, according to aspects of the present disclosure. In some implementations, predictive architecture 300 include predictive system 160, network 130, and data store 310 (which can be similar to the same as data store 140). In some implementations, predictive system 160 can use a model (e.g., initial model 190) to generate predictive data (e.g., predictive metrology data) for a particular process chamber. For example, model 190 can use knob data as input, and generate, as output, predictive metrology data for a particular process chamber. In some implementations, predictive system 160 can modify a model (e.g., initial model 190) to generate one or more modified models (e.g., modified model 192A-N). Predictive system 160 can then use modified models 192A-N to generate predictive data (e.g., predictive metrology data) based on input data (e.g., knob data). For example, initial model 190 can knob data as input, and generate, as output, predictive metrology data In some implementations, predictive system 160 can include predictive server 112, server machines 170 and 180, and predictive server 195. The predictive server 160, server machine 170, server machine 180, and predictive server 195 can each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

Server machine 170 includes a training set generator 172 that is capable of generating training data sets (e.g., a set of data inputs and a set of target outputs) to train, validate, and/or test a machine-learning model 190, 192A-N. Machine-learning model 190, 192A-N can be any algorithmic model capable of learning from data. In some implementations, machine-learning model 190, 192A-N can be a predictive model. In some implementations, the data set generator 172 can partition the training data into a training set, a validating set, and a testing set, which can be stored, as part of the training statistics 312, in the training data store 310. Training statistics 312 which can be accessible to the computing device predictive system 160 directly or via network 130. In some implementations, the predictive system 160 generates multiple sets of training data.

Server machine 180 can include a training engine 182, a validation engine 184, a selection engine 185, and/or a testing engine 186. An engine can refer to hardware (e.g., circuitry, dedicated logic, programmable logic, microcode, processing device, etc.), software (such as instructions run on a processing device, a general-purpose computer system, or a dedicated machine), firmware, microcode, or a combination thereof. Training engine 182 can be capable of training one or more machine-learning model 190, 192A-N. Machine-learning model 190 can, 192A-N refer to the model artifact that is created by the training engine 182 using the training data (also referred to herein as a training set) that includes training inputs and corresponding target outputs (correct answers for respective training inputs). The training engine 182 can find patterns in the training data that map the training input to the target output (the answer to be predicted), and provide the machine-learning model 190, 192A-N that captures these patterns. The machine-learning model 190, 192A-N can use one or more of a statistical modelling, support vector machine (SVM), Radial Basis Function (RBF), clustering, supervised machine-learning, semi-supervised machine-learning, unsupervised machine-learning, k-nearest neighbor algorithm (k-NN), linear regression, random forest, neural network (e.g., artificial neural network), etc.

One type of machine learning model that can be used to perform some or all of the above tasks is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities can be addressed, at lower layers, on top of which a multi-layer perceptron is commonly appended, mapping top layer features extracted by the convolutional layers to decisions (e.g., classification outputs). Deep learning is a class of machine learning algorithms that use a cascade of multiple layers of nonlinear processing units for feature extraction and transformation. Each successive layer uses the output from the previous layer as input. Deep neural networks can learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. In a plasma process tuning, for example, the raw input can be process result profiles (e.g., thickness profiles indicative of one or more thickness values across a surface of a substrate); the second layer can compose feature data associated with a status of one or more zones of controlled elements of a plasma process system (e.g., orientation of zones, plasma exposure duration, etc.); the third layer can include a starting recipe (e.g., a recipe used as a starting point for determining an updated process recipe the process a substrate to generate a process result the meets threshold criteria). Notably, a deep learning process can learn which features to optimally place in which level on its own. The “deep” in “deep learning” refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs can be that of the network and can be the number of hidden layers plus one. For recurrent neural networks, in which a signal can propagate through a layer more than once, the CAP depth is potentially unlimited.

In one implementation, one or more machine learning model is a recurrent neural network (RNN). An RNN is a type of neural network that includes a memory to enable the neural network to capture temporal dependencies. An RNN is able to learn input-output mappings that depend on both a current input and past inputs. The RNN will address past and future flow rate measurements and make predictions based on this continuous metrology information. RNNs can be trained using a training dataset to generate a fixed number of outputs (e.g., to determine a set of substrate processing rates, determine modification to a substrate process recipe). One type of RNN that can be used is a long short term memory (LSTM) neural network.

Training of a neural network can be achieved in a supervised learning manner, which involves feeding a training dataset consisting of labeled inputs through the network, observing its outputs, defining an error (by measuring the difference between the outputs and the label values), and using techniques such as deep gradient descent and backpropagation to tune the weights of the network across all its layers and nodes such that the error is minimized. In many applications, repeating this process across the many labeled inputs in the training dataset yields a network that can produce correct output when presented with inputs that are different than the ones present in the training dataset.

A training dataset containing hundreds, thousands, tens of thousands, hundreds of thousands or more sensor data and/or process result data (e.g., metrology data such as one or more thickness profiles associated with the sensor data) can be used to form a training dataset.

To effectuate training, processing logic can input the training dataset(s) into one or more untrained machine learning models. Prior to inputting a first input into a machine learning model, the machine learning model can be initialized. Processing logic trains the untrained machine learning model(s) based on the training dataset(s) to generate one or more trained machine learning models that perform various operations as set forth above. Training can be performed by inputting one or more of the sensor data into the machine learning model one at a time.

The machine learning model processes the input to generate an output. An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer can be another hidden layer or an output layer. In either case, the nodes at the next layer receive the output values from the nodes at the previous layer, and each node applies weights to those values and then generates its own output value. This can be performed at each layer. A final layer is the output layer, where there is one node for each class, prediction and/or output that the machine learning model can produce.

Accordingly, the output can include one or more predictions or inferences. For example, an output prediction or inference can include one or more predictions of film buildup on chamber components, erosion of chamber components, predicted failure of chamber components, and so on. Processing logic determines an error (i.e., a classification error) based on the differences between the output (e.g., predictions or inferences) of the machine learning model and target labels associated with the input training data. Processing logic adjusts weights of one or more nodes in the machine learning model based on the error. An error term or delta can be determined for each node in the artificial neural network. Based on this error, the artificial neural network adjusts one or more of its parameters for one or more of its nodes (the weights for one or more inputs of a node). Parameters can be updated in a back propagation manner, such that nodes at a highest layer are updated first, followed by nodes at a next layer, and so on. An artificial neural network contains multiple layers of “neurons”, where each layer receives as input values from neurons at a previous layer. The parameters for each neuron include weights associated with the values that are received from each of the neurons at a previous layer. Accordingly, adjusting the parameters can include adjusting the weights assigned to each of the inputs for one or more neurons at one or more layers in the artificial neural network.

After one or more rounds of training, processing logic can determine whether a stopping criterion has been met. A stopping criterion can be a target level of accuracy, a target number of processed images from the training dataset, a target amount of change to parameters over one or more previous data points, a combination thereof and/or other criteria. In one implementation, the stopping criteria is met when at least a minimum number of data points have been processed and at least a threshold accuracy is achieved. The threshold accuracy can be, for example, 70%, 80% or 90% accuracy. In one implementation, the stopping criterion is met if accuracy of the machine learning model has stopped improving. If the stopping criterion has not been met, further training is performed. If the stopping criterion has been met, training can be complete. Once the machine learning model is trained, a reserved portion of the training dataset can be used to test the model.

Once one or more trained machine learning models 190, 192A-N are generated, they can be stored in predictive server 195 as predictive component 197 or as a component of predictive component 197.

The validation engine 184 can be capable of validating machine-learning model 190 using a corresponding set of features of a validation set from training set generator 172. Once the model parameters have been optimized, model validation can be performed to determine whether the model has improved and to determine a current accuracy of the deep learning model. The validation engine 184 can determine an accuracy of machine-learning model 190 based on the corresponding sets of features of the validation set. The validation engine 184 can discard a trained machine-learning model 190 that has an accuracy that does not meet a threshold accuracy. In some implementations, the selection engine 185 can be capable of selecting a trained machine-learning model 190 that has an accuracy that meets a threshold accuracy. In some implementations, the selection engine 185 can be capable of selecting the trained machine-learning model 190, 192A-N that has the highest accuracy of the trained machine-learning models 190, 192A-N.

The testing engine 186 can be capable of testing a trained machine-learning model 190 using a corresponding set of features of a testing set from data set generator 172. For example, a first trained machine-learning model 190, 192A-N that was trained using a first set of features of the training set can be tested using the first set of features of the testing set. The testing engine 186 can determine a trained machine-learning model 190, 192A-N that has the highest accuracy of all of the trained machine-learning models based on the testing sets.

As described in detail below, predictive server 195 includes a predictive component 197 that is capable of providing data indicative of sensor clustering, and running trained machine-learning model 190, 192A-N on data items such as sensor data, statistics data, arrays, etc. input to obtain one or more outputs. The predictive server 195 can further provide sensor cluster data and/or anomaly detection data. This will be explained in further detail below.

It should be noted that in some other implementations, the functions of server machines 170 and 180, as well as predictive server 195, can be provided by a fewer number of machines. For example, in some implementations, server machines 170 and 180 can be integrated into a single machine, while in some other or similar implementations, server machines 170 and 180, as well as predictive server 195, can be integrated into a single machine.

In general, functions described in one implementation as being performed by server machine 170, server machine 180, and/or predictive server 195 can also be performed on client device 110. In addition, the functionality attributed to a particular component can be performed by different or multiple components operating together.

In some implementations, a manufacturing system can include more than one process chambers. For example, example manufacturing system 200 of FIG. 2 illustrates multiple process chambers 214, 216, 218. It should be noted that, in some implementations, data obtained to train the machine-learning model 190, 192A-N and data collected to be provided as input to the machine-learning model can be associated with the same process chamber of the manufacturing system. In other or similar implementations, data obtained to train the machine-learning model and data collected to be provided as input to the machine-learning model can be associated with different process chambers of the manufacturing system. In other or similar implementations, data obtained to train the machine-learning model can be associated with a process chamber of a first manufacturing system and data collected to be provide as input to the machine-learning model can be associated with a process chamber of a second manufacturing system.

Figure 4:
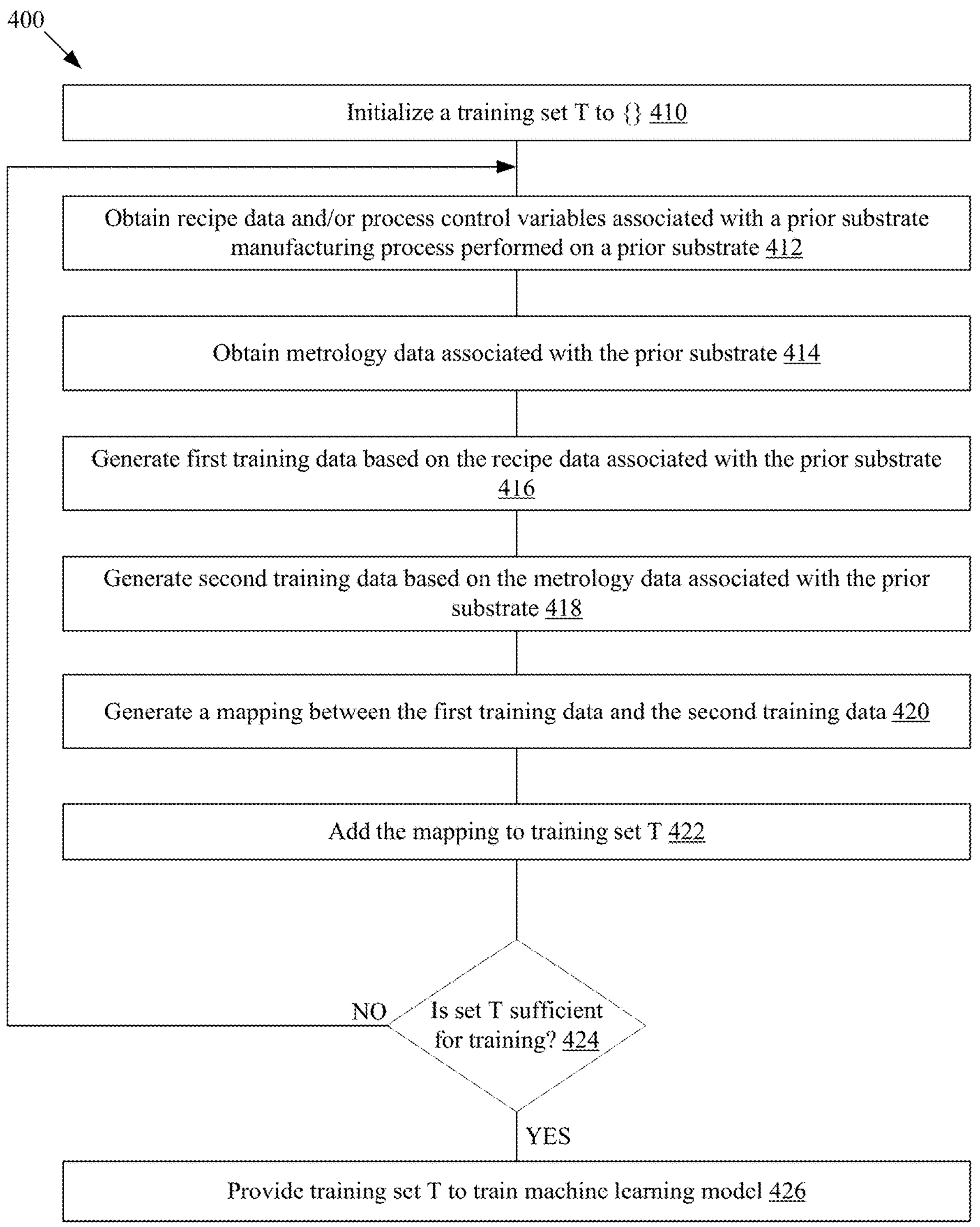
FIG. 4 is a flow chart of a method for training an initial machine-learning model, in accordance with some implementations of the present disclosure.

FIG. 4 is a flow chart of a method 400 for training an initial machine-learning model, according to aspects of the present disclosure. Method 400 is performed by processing logic that can include hardware (circuitry, dedicated logic, etc.), software (such as is run on a general-purpose computer system or a dedicated machine), firmware, or some combination thereof. In one implementation, method 400 can be performed by a computer system, such as computer system architecture 100 of FIG. 1. In other or similar implementations, one or more operations of method 400 can be performed by one or more other machines not depicted in the figures. In some aspects, one or more operations of method 400 can be performed by client device 110, model generation system 150, server machine 170, server machine 180, and/or predictive server 195.

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

At operation 410, processing logic initializes a training set T to an empty set (e.g., { }).

At operation 412, processing logic obtains recipe data and/or process control variables (e.g., knob values) associated with a prior substrate manufacturing process (e.g., deposition process, etch process, etc.) to perform one or more processes on a prior substrate. In some implementations, the recipe data and/or process control variables associated with the substrate manufacturing process is historical data associated with one or more prior deposition settings for a prior deposition process previously performed for a prior substrate at a manufacturing system. In some implementations, the recipe data and/or process control variables can be associated with a prior etching process performed on the prior substrate, or any other process performed in the process chamber.

At operation 414, processing logic obtains metrology data associated with the prior substrate. For example, the metrology data can include film thickness data associated with a film deposited on the surface of the prior substrate, etch data associated with an etch process performed on the substrate, etc. Film thickness data can refer to a thickness measurement of individual film layer(s), total film stack(s), and/or aggregated layer stack(s). Film thickness data can include historical film thickness data for a prior film deposited on a surface of a prior substrate. In some implementations, the historical film thickness data for the prior film can correspond to a historical metrology measurement value associated with the prior film. Processing logic can obtain the metrology data (e.g., film thickness data associated with the deposited film, etch data associated with an etch process performed on the substrate, etc.) from data store 140, in accordance with previously described implementations.

At operation 416, processing logic generates first training data based on the obtained recipe data and/or process control variables associated with the prior substrate manufacturing process performed on the prior substrate. At operation 418, processing logic generates second training data based on the metrology data (e.g., film thickness, etch depth, etc.) obtained from the prior substrate.

At operation 420, processing logic generates a mapping between the first training data and the second training data. The mapping refers to the first training data that includes or is based on recipe data and/or process control variables for the prior substrate manufacturing process performed for the prior substrate and the second training data that includes or is based on metrology data obtained from the prior substrate, where the first training data is associated with (or mapped to) the second training data. At operation 422, processing logic adds the mapping to the training set T.

At operation 424, processing logic determines whether the training set, T, includes a sufficient amount of training data to train a machine-learning model. It should be noted that in some implementations, the sufficiency of training set T can be determined based simply on the number of mappings in the training set, while in some other implementations, the sufficiency of training set T can be determined based on one or more other criteria (e.g., a measure of diversity of the training examples, etc.) in addition to, or instead of, the number of input/output mappings. Responsive to determining the training set does not include a sufficient amount of training data to train the machine-learning model, method 400 returns to operation 412. Responsive to determining the training set T includes a sufficient amount of training data to train the machine-learning model, method 400 continues to operation 426.

At operation 426, processing logic provides the training set T to train the machine-learning model. In one implementation, the training set T is provided to training engine 182 of server machine 180 to perform the training. In the case of a neural network, for example, input values of a given input/output mapping are input to the neural network, and output values of the input/output mapping are stored in the output nodes of the neural network. The connection weights in the neural network are then adjusted in accordance with a learning algorithm (e.g., backpropagation, etc.), and the procedure is repeated for the other input/output mappings in the training set T.

In some implementations, the processing logic can perform outlier detection methods to remove anomalies from the training set T prior to training the machine-learning model. Outlier detection methods can include techniques that identify values that differs significantly from the majority the training data. These values can be generated from errors, noise, etc.

After operation 426, machine-learning model can be used to generate one or more values (predictive data) associated with the expected metrology data generated, by the process chamber executing a particular process recipe, on a virtual substrate.

Method 400 is an illustrative example of generating an initial machine-learning model. It is noted that other methods for generating the initial machine-learning model can be used.

Figure 5:
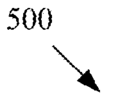
FIG. 5 is a flow chart of a method for training a modified machine-learning model, in accordance with some implementations of the present disclosure.
Figure 5:
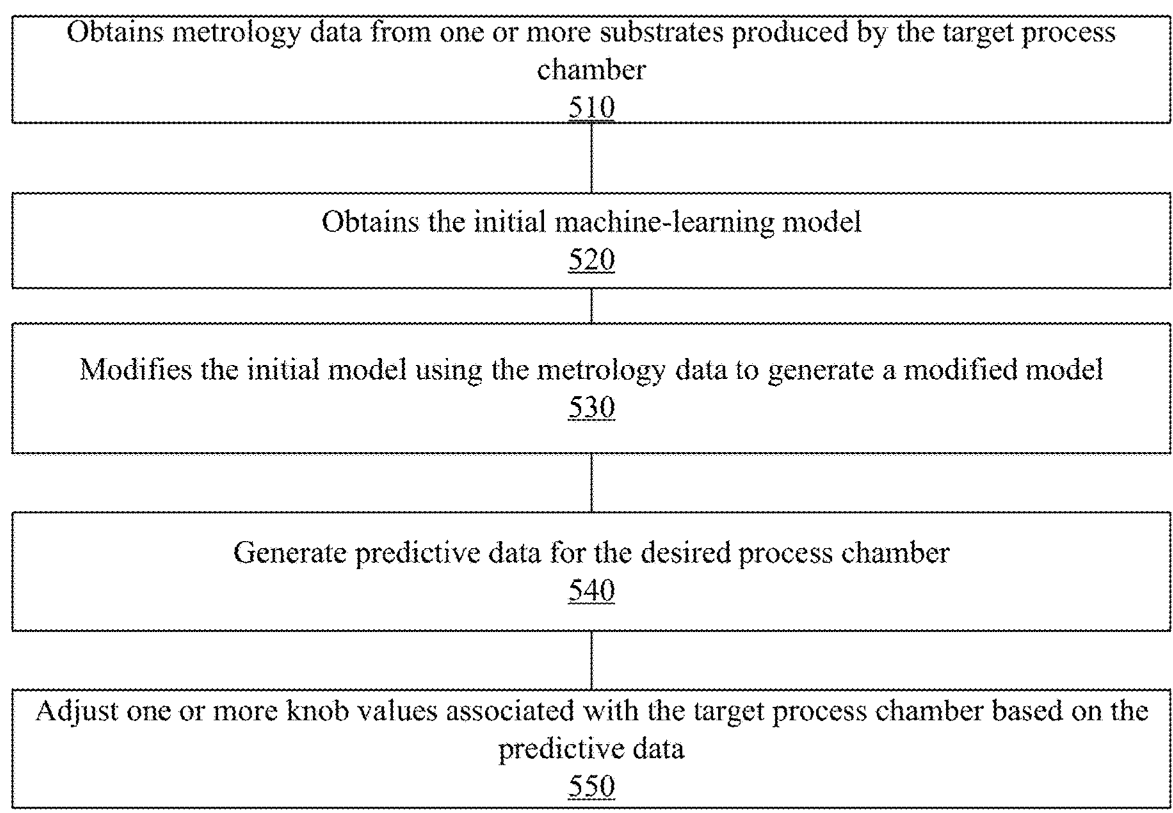

FIG. 5 is a flow chart of a method 500 for modifying the machine-learning model and optimizing a target process chamber based on the modified model, according to aspects of the present disclosure. Method 500 is performed by processing logic that can include hardware (circuitry, dedicated logic, etc.), software (such as is run on a general-purpose computer system or a dedicated machine), firmware, or some combination thereof. In one implementation, method 500 can be performed by a computer system, such as computer system architecture 100 of FIG. 1. In other or similar implementations, one or more operations of method 500 can be performed by one or more other machines not depicted in the figures. In some aspects, one or more operations of method 500 can be performed by client device 110, model generation system 150, server machine 170, server machine 180, and/or predictive server 195.

Method 500 describes the operations performed to update a machine-learning model (e.g., initial model 190) for a target process chamber. In some implementations, the target process chamber is an altered process chamber (e.g., the process chamber that the initial model 190 was developed for after said process chamber experienced deterioration conditions, maintenance operations, etc.). In some implementations, the target process chamber is a different process chamber (a process chamber other than the one that initial model 190 was generated for).

At operation 510, processing logic obtains metrology data from one or more substrates produced by the target process chamber. For example, the processing logic can obtain film thickness data, etch depth data, etc. associated with one or more substrates processed by the target process chamber. In implementations where metrology data from two or more substrates is obtained, the processing logic can normalize the metrology data (e.g., average the data points from correlating locations on the substrate).

At operation 520, processing logic obtains the initial machine-learning model. For example, the processing logic can obtain initial model 190. The initial model can be generated using method 400.

Figure 8:
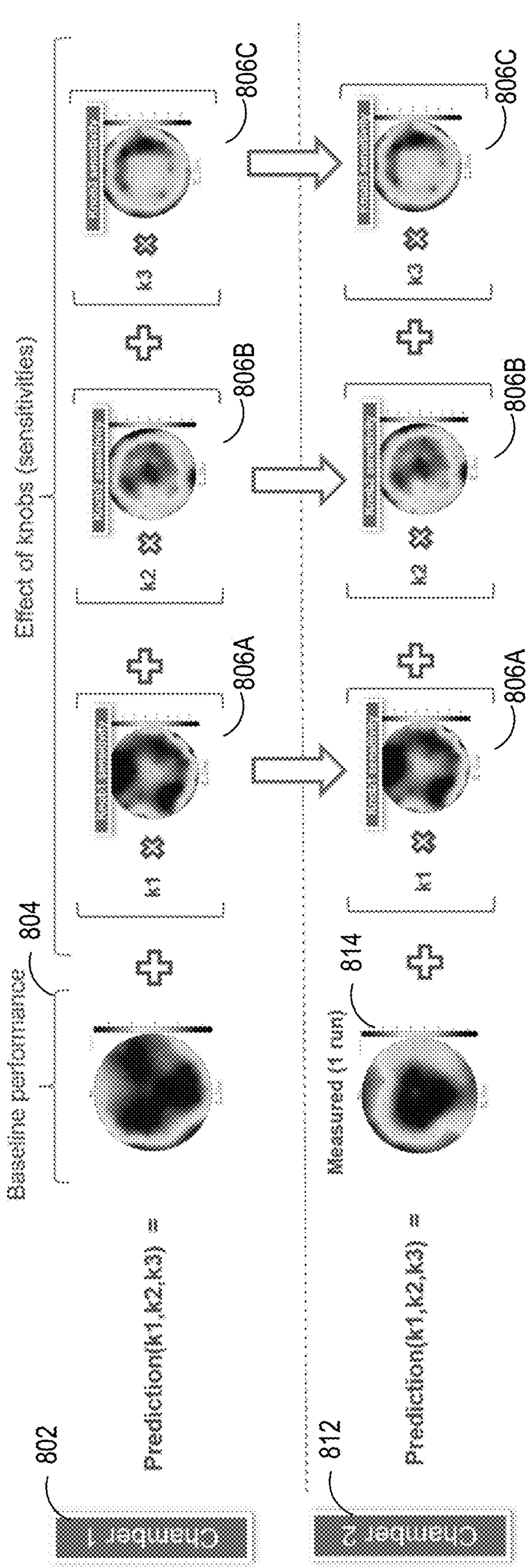
FIG. 8 is an illustration showing model parameters for an initial model and for a modified model, in accordance with some implementations of the present disclosure.

At operation 530, processing logic modifies the initial model using the metrology data to generate a modified model (e.g., modified model 192A-N). In some implementations, to modify the initial model, processing logic can train a new machine-learning model using components of the initial model and the metrology data. In one example, the processing logic can use metrology data as a new baseline performance while maintaining the process sensitivities of one or more knobs. FIG. 8 is an illustration showing model parameters for an initial model generated for chamber 802, and model parameters for a modified model generated for chamber 812. The initial model can be trained using metrology data obtained from set of substrates (e.g., a dozen or more substrates) produced by process chamber 802. The metrology data 804 determined from the set of substrates can be used to determine process sensitivities of knob k1, k2, and k3 (expressed by 806A-C). To train the modified model for use by process chamber 812, metrology data 814 from a single substrate produced by process chamber 812 can be obtained and the process sensitivities of knob k1, k2, and k3 can be transferred to train the modified model. Once trained, the modified model can be used to generate prediction data (discussed in operation 540) for process chamber 812. For example, three knob settings (e.g., k1, k2, and k3) can be input into the modified model and predictive data (e.g., predictive metrology data) can be generated by the modified model.

Returning to FIG. 5, in another example, processing logic can send the metrology data from the target process chamber and data from the initial model 190 to predictive system 160. The data from the initial model can include one or more classifiers or layers (e.g., regression layers) that map features to a desired output space, one or more convolution filters, etc. The predictive system 160 can then train the modified model using the metrology data from the target process chamber and the data from the initial model. Once trained, the modified model can be used to generate predictive data for the target process chamber.

At operation 540, processing logic generates, using the modified model, predictive data for the desired process chamber. In some implementations, the processing logic can input, into the modified model, one or more knob settings and the modified model can generate predictive metrology data. In another implementation, the processing logic can input, into the modified model, reference spatial measurements and the modified model can generate a recommended recipe for a given process.

In some implementations, the predictive data can include delta values to apply to the current knob settings of the target process chamber. For example, the target spatial measurements and the current knob settings can be input into the modified model. In response, the modified model can generate a delta value to apply to the current knob setting to configure the target process chamber to generate a substrate with the target spatial measurements.

Figure 9:
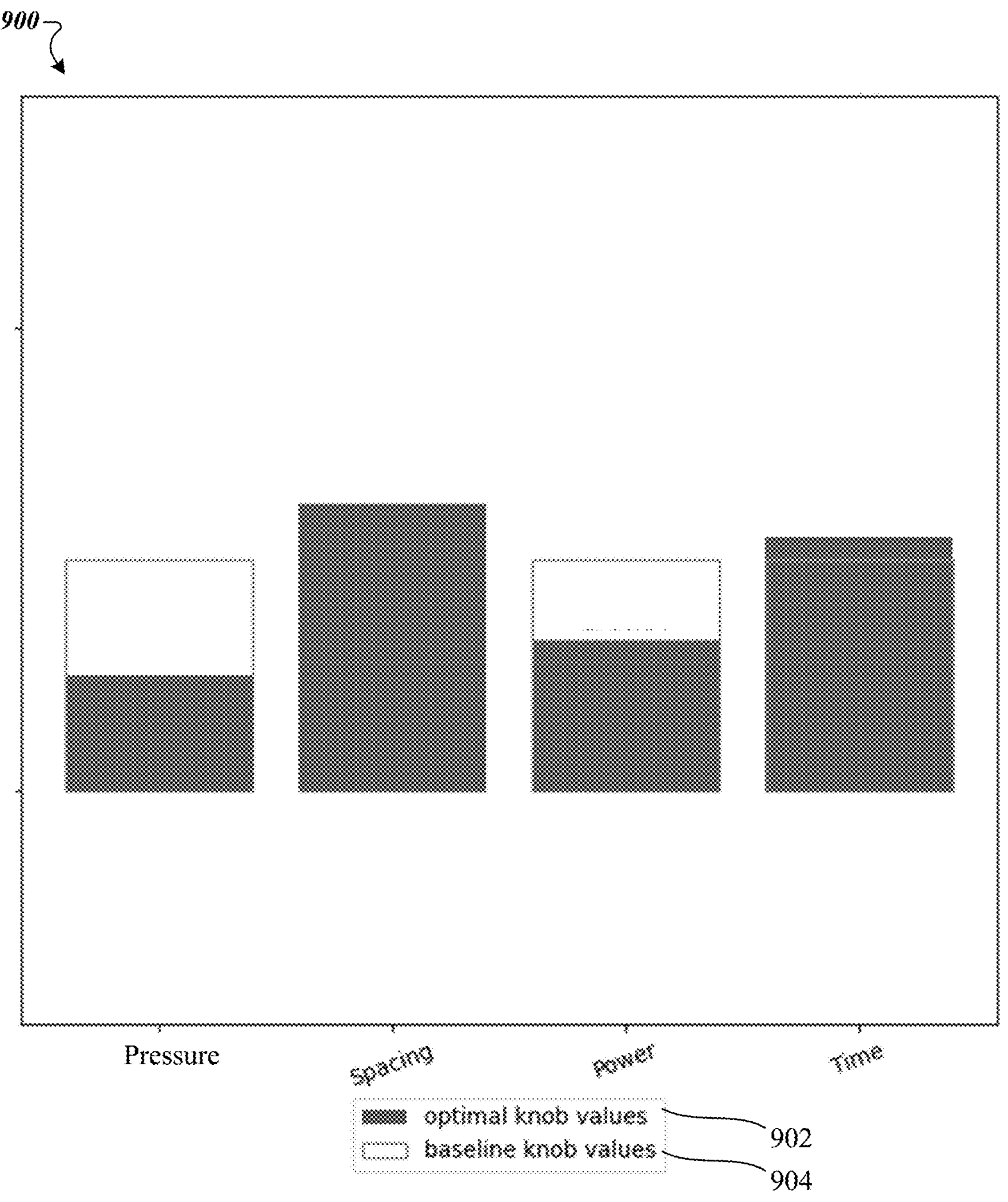
FIG. 9 is a graph showing baseline and optimal values for four knobs, in accordance with some implementations of the present disclosure.

FIG. 9 is a graph 900 showing baseline and optimal values for four knobs. In particular, graph 900 shows the baseline knob values 902 for the pressure setting, spacing setting, power setting, and time setting as indicated by a process recipe. Graph 900 further shows the optimal knob values 902 for the pressure setting, spacing setting, power setting, and time setting. The optimal values can be generated by the modified model and reflect the required knob values needed to obtain the desired substrate profile (e.g., spatial measurements) using the target process chamber. The delta can be the differences in value between the baseline knob value and the optimal knob value.

Returning to FIG. 5, at operation 550, the processing logic can perform a corrective action to the target process chamber based on the predictive data. In one implementation, the processing logic can adjust the knob values by applying the delta values to the current knob setting of the target process chamber. The processing logic can perform the corrective action using, for example, corrective action component 114.

Figure 10:
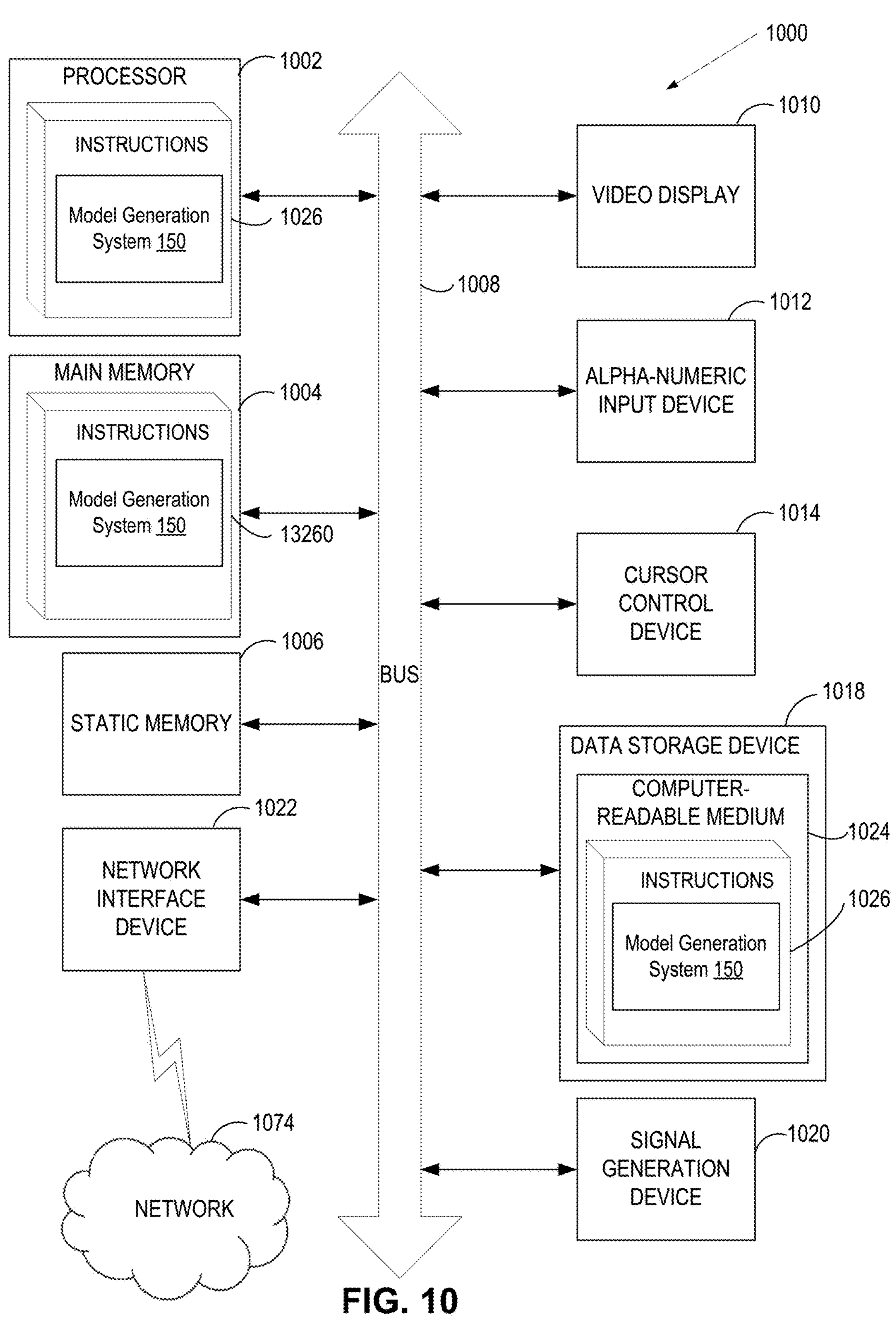
FIG. 10 is a block diagram illustrating a computer system, according to certain implementations.

FIG. 10 is a block diagram illustrating a computer system 1000, according to certain implementations. In some implementations, computer system 1000 can be connected (e.g., via a network, such as a Local Area Network (LAN), an intranet, an extranet, or the Internet) to other computer systems. Computer system 1000 can operate in the capacity of a server or a client computer in a client-server environment, or as a peer computer in a peer-to-peer or distributed network environment. Computer system 1000 can be provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 1000 can include a processing device 1002, a volatile memory 1004 (e.g., Random Access Memory (RAM)), a non-volatile memory 1006 (e.g., Read-Only Memory (ROM) or Electrically-Erasable Programmable ROM (EEPROM)), and a data storage device 1018, which can communicate with each other via a bus 1008.

Processing device 1002 can be provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

Computer system 1000 can further include a network interface device 1022 (e.g., coupled to network 1074). Computer system 1000 also can include a video display unit 1010 (e.g., an LCD), an alphanumeric input device 1012 (e.g., a keyboard), a cursor control device 1014 (e.g., a mouse), and a signal generation device 1020.

In some implementations, data storage device 1018 can include a non-transitory computer-readable storage medium 1024 on which can store instructions 1026 encoding any one or more of the methods or functions described herein, including instructions encoding components of FIG. 1 (e.g., model generation system 150, initial model generation component 152, model modification component 154, predictive system 160, etc. . . . ) and for implementing methods described herein.

Instructions 1026 can also reside, completely or partially, within volatile memory 1004 and/or within processing device 1002 during execution thereof by computer system 1000, hence, volatile memory 1004 and processing device 1002 can also constitute machine-readable storage media.

While computer-readable storage medium 1024 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein can be implemented by discrete hardware components or can be integrated in the functionality of other hardware components such as ASICS, FPGAs, DSPs or similar devices. In addition, the methods, components, and features can be implemented by firmware modules or functional circuitry within hardware devices. Further, the methods, components, and features can be implemented in any combination of hardware devices and computer program components, or in computer programs.

Unless specifically stated otherwise, terms such as "receiving," "performing," "providing," "obtaining," "causing," "accessing," "determining," "adding," "using," "training," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and cannot have an ordinal meaning according to their numerical designation.

Examples described herein also relate to an apparatus for performing the methods described herein. This apparatus can be specially constructed for performing the methods described herein, or it can include a general purpose computer system selectively programmed by a computer program stored in the computer system. Such a computer program can be stored in a computer-readable tangible storage medium.

The methods and illustrative examples described herein are not inherently related to any particular computer or other apparatus. Various general purpose systems can be used in accordance with the teachings described herein, or it can prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method, comprising:

identifying a first machine-learning model trained to generate first predictive data for a first process chamber;

obtaining metrology data associated with a substrate processed by a second process chamber; and training a second machine-learning model based on the first machine-learning model and the metrology data by performing a transfer learning operation, wherein data associated with the first machine-learning model is used to train the second machine-learning model, and, wherein the second machine-learning model is trained to generate second predictive data associated with the second process chamber.

2. The method of claim 1, wherein the second predictive data comprises at least one of predictive metrology data or predictive process control variables data.

3. The method of claim 1, wherein training the second machine-learning model is further based on one or more process sensitivity values obtained from the first machine-learning model.

4. The method of claim 1, further comprising:

performing a corrective action based on the second predictive data.

5. The method of claim 4, wherein the corrective action comprises applying an adjustment value to a knob associated with the second process chamber.

6. The method of claim 1, wherein the second process chamber comprises the first process chamber in a different state.

7. The method of claim 1, wherein training the second machine-learning model comprises performing a transfer learning operation associated with the first machine-learning model.

8. An electronic device manufacturing system, comprising:

a memory device; and a processing device, operatively coupled to the memory device, to perform operations comprising:

identifying a first machine-learning model trained to first generate predictive data for a first process chamber;

obtaining metrology data associated with a substrate processed by a second process chamber; and training a second machine-learning model based on the first machine-learning model and the metrology data by performing a transfer learning operation, wherein data associated with the first machine-learning model is used to train the second machine-learning model, and, wherein the second machine-learning model is trained to generate second predictive data associated with the second process chamber.

9. The electronic device manufacturing system of claim 8, wherein the second predictive data comprises at least one of predictive metrology data or predictive process control variables data.

10. The electronic device manufacturing system of claim 8, wherein training the second machine-learning model is further based on one or more process sensitivity values obtained from the first machine-learning model.

11. The electronic device manufacturing system of claim 8, wherein the operations further comprise:

performing a corrective action based on the second predictive data.

12. The electronic device manufacturing system of claim 11, wherein the corrective action comprises applying an adjustment value to a knob associated with the second process chamber.

13. The electronic device manufacturing system of claim 8, wherein the second process chamber comprises the first process chamber in a different state.

14. The electronic device manufacturing system of claim 8, wherein training the second machine-learning model comprises performing a transfer learning operation associated with the first machine-learning model.

15. A method, comprising:

providing input data to a first machine-learning model trained to generate first predictive data for a first process chamber, the input data comprising a value associated with a knob that controls a substrate manufacturing process, wherein the first machine-learning model is trained by performing a transfer learning operation in which data associated with a second machine-learning model trained to generate second predictive data for a second process chamber is used to train the first machine-learning model, and metrology data associated with a prior substrate processed by the first process chamber; and obtaining one or more output values of the first machine-learning model, the one or more output values reflecting a predictive dimension on a substate.

16. The method of claim 15, wherein the first predictive data comprises at least one of predictive metrology data or predictive process control variables data.

17. The method of claim 15, wherein the first machine-learning model is trained based on one or more process sensitivity values obtained from the second machine-learning model.

18. The method of claim 15, further comprising:

performing a corrective action based on the predictive dimension.

19. The method of claim 18, wherein the corrective action comprises applying an adjustment value to a knob associated with the first process chamber.

20. The method of claim 15, wherein the first machine-learning model is trained using a transfer learning operation associated with the second machine-learning model.

* * * * *